(12) United States Patent
Ma et al.

(10) Patent No.: US 6,593,033 B1
(45) Date of Patent: Jul. 15, 2003

(54) ATTENUATED RIM PHASE SHIFT MASK

(75) Inventors: Zhiliu Ma, Plano, TX (US); Anthony Yen, Austin, TX (US); Cesar Garza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/399,840

(22) Filed: Sep. 21, 1999

Related U.S. Application Data

(60) Provisional application No. 60/101,289, filed on Sep. 22, 1998.

(51) Int. Cl.⁷ ................................................ G03F 9/00
(52) U.S. Cl. ......................................................... 430/5
(58) Field of Search ............................. 430/5, 322, 323, 430/324

(56) References Cited

U.S. PATENT DOCUMENTS

| | | | |
|---|---|---|---|
| 5,302,477 A | | 4/1994 | Dao et al. |
| 5,354,632 A | | 10/1994 | Dao et al. |
| 5,403,682 A | | 4/1995 | Lin |
| 5,478,678 A | * | 12/1995 | Yang et al. ................... 430/5 |
| 5,620,817 A | * | 4/1997 | Hsu et al. ..................... 430/5 |
| 5,914,202 A | * | 6/1999 | Nguyen et al. ............... 430/5 |
| 5,935,736 A | * | 8/1999 | Tzu .............................. 430/5 |
| 5,939,225 A | * | 8/1999 | Dove et al. .................. 430/5 |

* cited by examiner

*Primary Examiner*—John A. McPherson
*Assistant Examiner*—Saleha R. Mohamedulla
(74) *Attorney, Agent, or Firm*—Frederick J. Telecky, Jr.; W. James Brady, III

(57) ABSTRACT

An embodiment of the instant invention is a mask having a pattern which is transferred to a layer overlying a semiconductor wafer, the mask comprising: a transmissive portion (structure 102 of FIG. 1), the transmissive portion allowing energy which impinges upon the transmission portion to substantially pass through the transmissive portion; a substantially non-transmissive portion (structure 106 of FIG. 1); a semi-transmissive portion (structure 104 of FIG. 1) situated between the transmissive portion and the substantially non-transmissive portion, energy passing through the semi-transmissive portion having a phase; and wherein the phase of energy which passes through the semi-transmissive portion is out of phase with the phase of energy which passes through the transmissive portion. Preferably, the phase of the energy which passes through the semi-transmissive portion is around 180 degrees out of phase with energy which passes through the transmissive portion.

8 Claims, 2 Drawing Sheets f=−1.0μm f=−0.6μm f=−0.2μm f=0.2μm

ATTENUATED RIM PHASE SHIFT MASK

This application claims priority under 35 USC §119(e)(1) of U.S. provisional application No. 60/101,289 filed Sep. 22, 1998.

FIELD OF THE INVENTION

The instant invention pertains to semiconductor device fabrication and processing and more specifically to a novel phase-shift lithography mask.

BACKGROUND OF THE INVENTION

Presently, optical microlithography is the most-favored technology for the mass production of semiconductor devices. This technology involves printing a pattern or relief image on a recording medium, known as photoresist, using a projection camera as the pattern exposing tool. These cameras, known as steppers, scanners, or step-and-scanners, project a master pattern contained in a mask or reticle onto a wafer coated with a light sensitive material, known as photoresist. A problem with present optical microlithography methods is that they are diffraction limited. In other words, the smallest features that can be printed are limited by the diffraction of the light as it passes through the openings in the reticle. One method used to circumvent this problem involves phase shifting the light on the reticle 180 degrees so as to improve the contrast of the aerial image. Different types of phase shift methods have been proposed but problems involving mask making processes have limited the number of techniques that have been introduced into production.

Typically, the mask (or reticle) is comprised of a piece of quartz on which the desired patterns are etched in chromium or other opaque material. The exposure light is blocked wherever there is the opaque material and the light is transmitted to the wafer in places devoid of the opaque material. Hence, the mask pattern is transferred to the wafer surface by the lithography process. Since only two different regions appear on the standard reticle (i.e. an opaque portion and a non-opaque portion), this type of reticle is called a binary reticle.

An attenuated phase shift mask, APSM, uses a special semi-transparent material which allows a certain amount of light to pass through. The transmission of this type of film is typically less than 14 percent. By adjusting the film thickness, the phase of the light transmitted through this semi-transmissive material can change by 180 degrees. In this manner, the destructive interference in terms of transmitted and semi-transmitted light can occur at the tail of the aerial image. This destructive interference can improve the contrast of the aerial image in addition to the resolution and the depth of focus.

A limitation of the APSM involves the printing of sidelobes. Due to diffraction, the amplitude of the electrical field can change from a positive global maximum to a negative local minimum. The first local minimum of the electrical field, or the first maximum in terms of light intensity (which is the square of the electric field), is the main contributor of sidelobe printing. Generally, other peaks in the electrical field distribution are too small to have a significant impact. If the first local maxima of light intensity from transparent features near the mask feature are close to one another on the wafer plane, or even worse, they have similar phase angles, the total light intensity, by coherent and incoherent constructive interference, can be higher than the resist develop threshold. This will result in the printing of sidelobes. Though this phenomenon does not usually occur if a binary mask is utilized, it is a serious problem for attenuated phase shift masks. This is especially true if the transmittance of the semi-transparent material is high. For attenuated phase shift masks, light transmitted through the semi-transparent materials will coherently or incoherently add to the overlap region, in addition to the first intensity maxima introduced by nearby open features, thereby making the sidelobe much more readily printed than with the binary mask. Sidelobes cause problems because an undesired opening may be formed in the layer to be patterned.

SUMMARY OF THE INVENTION

The attenuated phase shift mask of the instant invention is basically comprised of three components: an open area, a phase-shift area (preferably comprised of a semi-transmissive region), and an opaque area (preferably comprised of chromium). The phase-shift area is preferably situated between the open area and the opaque area. Preferably, the energy transmitted through the phase-shift area is around 180 degrees out of phase in comparison to the light transmitted through the open area. The transmittance of the mask of the instant invention can be quite high, whereas the transmittance in a conventional attenuated phase shift mask must be kept low so as to reduce the printing of the sidelobes.

An embodiment of the instant invention is a mask having a pattern which is transferred to a layer overlying a semiconductor wafer, the mask comprising: a transmissive portion, the transmissive portion allowing energy which impinges upon the transmission portion to substantially pass through the transmissive portion; a substantially non-transmissive portion; a semi-transmissive portion situated between the transmissive portion and the substantially non-transmissive portion, energy passing through the semi-transmissive portion having a phase; and wherein the phase of energy which passes through the semi-transmissive portion is out of phase with the phase of energy which passes through the transmissive portion. Preferably, the phase of the energy which passes through the semi-transmissive portion is around 180 degrees out of phase with energy which passes through the transmissive portion.

Another embodiment of the instant invention is a mask having a repeating pattern which is transferred to a layer overlying a semiconductor wafer so as to define a repeating feature over the semiconductor wafer, the mask comprising: a transmissive portion which allows energy impinging upon it to substantially pass through it, the energy passing through the transmissive portion of the mask having a phase; a substantially non-transmissive portion which substantially impedes energy impinging upon it to pass through; a semi-transmissive portion situated between the transmissive portion and the substantially non-transmissive portion of the mask, energy passing through the semi-transmissive portion having a phase which is different than the phase of energy passing through the transmissive portion of the mask; and wherein the transmissive portion has a shape selected from the group consisting of: rectangular, circular, oval, octagonal, square, and any combination thereof. Preferably, the phase of the energy passing through the semi-transmissive portion is around 180 degrees out of phase with the energy passing through transmissive portion. The substantially non-transmissive portion is, preferably, comprised of chromium. Preferably, the semi-transmissive portion is comprised of a material which allows between 2 and 18 percent (more preferably 6–12%—even more preferably 8–10%) of the impinging energy to pass through the semi-transmissive portion. The impinging energy is, preferably, comprised of: DUV energy, I-line energy, x-ray energy, electron beam energy, optical energy and any combination thereof, and the thickness of the semi-transmissive portion is, preferably, around one-half the wavelength of the impinging energy. Preferably, the semi-transmissive portion is concentric to the transmissive portion, and the edge of the semi-transmissive portion which abuts the substantially non-transmissive portion has the same shape as the edge of the semi-transmissive portion which abuts the transmissive portion.

BRIEF DESCRIPTION OF THE DRAWINGS

FIG. 1a is a schematic of the mask layout of one embodiment of the instant invention. FIG. 1b is a graph illustrating the critical dimension provided by a conventional binary mask and the mask of FIG. 1a versus focus. FIG. 1c is an SEM picture of holes formed using the mask of FIG. 1a. FIG. 1d is an SEM picture of holes formed using a conventional attenuated phase shift mask (APSM).

DETAILED DESCRIPTION OF THE DRAWINGS

In essence, the instant invention is a phase shift mask which is comprised of three elements: an open area, a semi-transmissive area; and a substantially non-transmissive area. Preferably, the open area is comprised of a material, such as quartz, that is substantially transmissive for the type of exposure system (optical lithography, electron beam, x-ray, or other energy source lithography) that is used to expose the masking material. This area is illustrated as area 102 of FIG. 1a. While area 102 is rectangular in FIG. 1a, it can be any shape desired to pattern a certain feature over a semiconductor substrate. Hence, area 102 can be square in shape or rectangular, circular, oval, octagonal, or any other complex or simple shape. In addition, area 102 can be of nearly any dimension required to pattern a given shape onto a layer overlying a semiconductor substrate. The only limitation on area 102 of the mask of the instant invention (or more precisely on the lithography system using the mask of the instant invention) is that it should not be much less than one-half the wavelength (preferably not less than one wavelength) used to expose underlying layer.

Figure 1A:
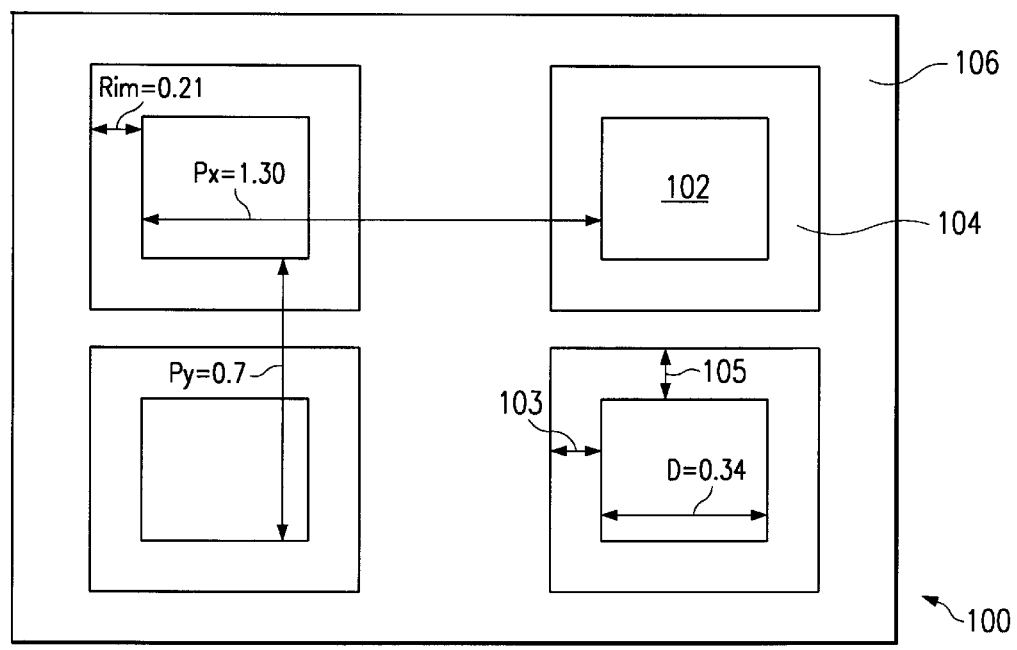
FIGS. 1a–1c illustrate one embodiment of the instant invention and FIG. 1d illustrates the results of a conventional attenuated phase shift mask.

Region 106 of the mask of FIG. 1a is preferably substantially not transmissive with respect to the energy of the developing system impinging upon it. In other words, region 106 preferably does not allow a substantial (most preferably, it does not allow any) amount of the developing system energy to transmit through it. Region 106 may be fabricated from chromium or any other metallic or non-metallic material that does not allow an appreciable amount of the exposing energy to pass through it.

Semi-transmissive region 104 is preferably situated between opening 102 and non-transmissive region 106. Region 104 may have the same shape as opening 102 or its outer perimeter (the perimeter that abuts to region 106) may be different than the shape of its inner perimeter (the perimeter that abuts to region 102). In addition, x-dimension 103 may or may not be the same as y-dimension 105. With reference to this specification, one of ordinary skill in the art should be able to derive the exact dimensions of x-dimension 103, y-dimension 105 and the shape of the inner and outer perimeters of region 104. Dimensions are provided in FIG. 1a. These dimensions were used to create the pattern of FIG. 1c. Hence, region 104 extends from region 102 to around one-half of the feature size (more specifically, a 0.21 wide square ring around region 102).

More specifically, the rim width, W, could be:

$$(\tfrac{1}{2})*D < W < \{[(0.82)(\text{exposure wavelength})/(NA)] - (\tfrac{1}{2})*D\}$$

where D is the pattern hole size and NA is the numerical aperture of the projection lens. The low limit is determined by the requirement of resolution improvemnent. The upper limit is determined by the desire to reduce the effects of sidelobes. The first order of diffraction maximum of the point spread function is located at [(0.82)(exposure wavelength)/(NA)]. Since the image is the convolution of the object intensity distribution with the point spread function, the equation $\{[(0.82)(\text{exposure wavelenth})/(NA)]-(\tfrac{1}{2})*D\}$ will take into account regions reached by the first order maximum from the right half of the object hole covered by the chrome shield. Hence, the likelihood of printing a sidelobe is significantly reduced.

If the pattern density is too great and the above equation can not be met (e.g. if the array pitch equals 2D), then there will be no chrome shield region left. Another method must be used at this point. For example, the film transmittance can be reduced, a shorter exposure wavelength may be used, or the rim width can be reduced or extra openings can be added to the sidelobe region.

Semi-transmissive region 104 is preferably comprised of a material that will allow somewhere between 2 and 18% of the energy impinging upon it to be transmitted. More preferably, the material would allow somewhere between 4 to 14% to be transmitted (and even more preferably around 6 to 12% and even more preferably around 8 to 10% to be transmitted through region 104). In other words, energy transmitted through region 104 is preferably attenuated and phase shifted by approximately 180 degrees as compared to energy passing through region 102. Depending upon the attenuation desired and the amount of phase-shift desired for a given exposure wavelength, the thickness and composition of region 104 can be varied. For example 193 nm DUV and I-line use different films and thickness. More specifically, region 104 may be comprised of Mosion and it may have a thickness of around one-half the exposure wavelength of the optical path.

Figure 1B:
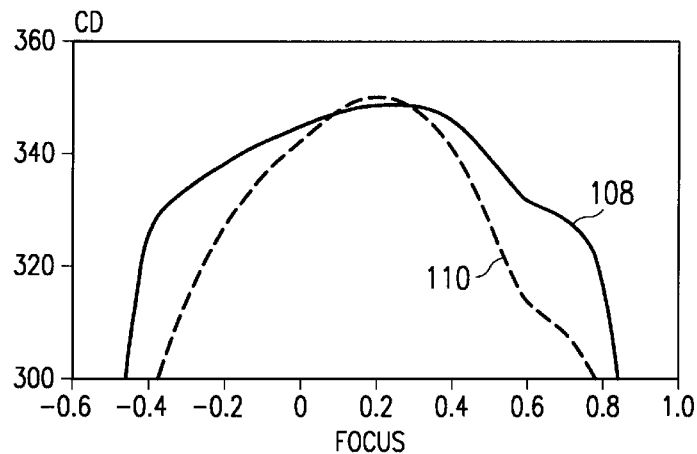

FIG. 1b illustrates the depth of focus (DOF) measurement taken on a bare silicon wafer. Curve 108 illustrates the data for the mask of one embodiment of the instant invention as is illustrated in FIG. 1a. The dashed curve is the DOF data for a binary mask. The DOF using this embodiment of the instant invention is better then that of the binary mask.

Figure 1C:
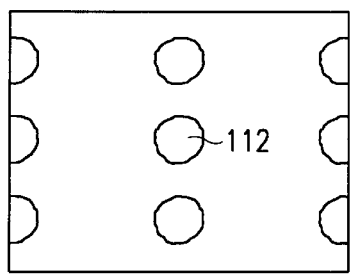
Figure 1D:
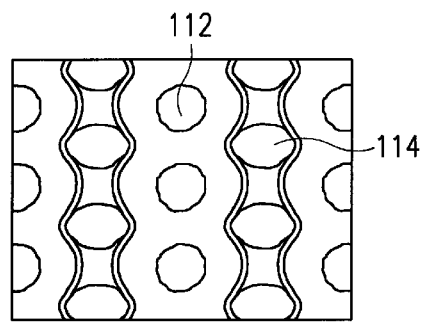
Figure 2A:
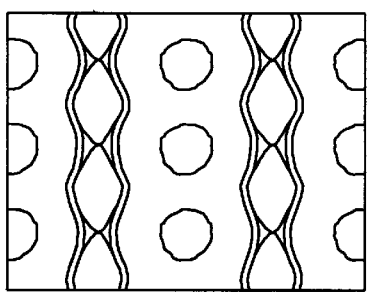
FIGS. 2a and 2b are SEM pictures of holes formed in a layer over a semiconductor substrate using a conventional APSM mask and a mask of another embodiment of the instant invention, respectively.
Figure 2B:
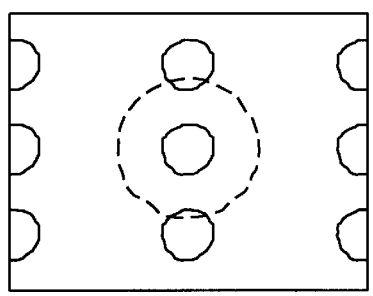
Figure 3A:
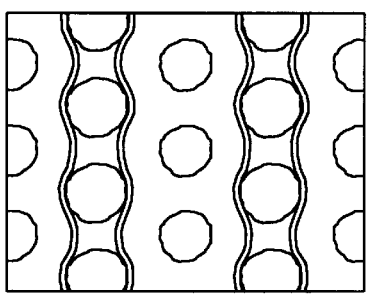
FIGS. 3a and 3b are SEM pictures of holes formed in a layer over a semiconductor substrate using a conventional APSM mask and a mask of another embodiment of the instant invention, respectively.
Figure 3B:
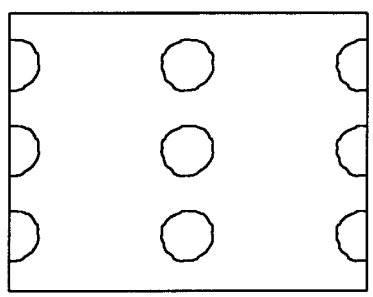
Figure 4A:
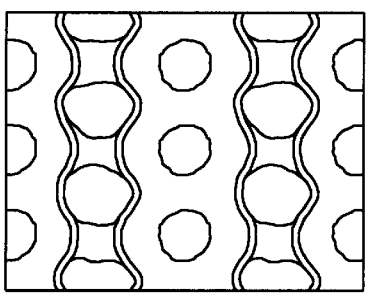
FIGS. 4a and 4b are SEM pictures of holes formed in a layer over a semiconductor substrate using a conventional APSM mask and a mask of another embodiment of the instant invention, respectively.
Figure 4B:
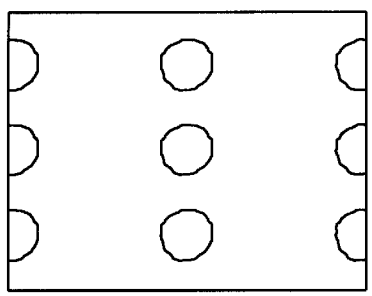
Figure 5A:
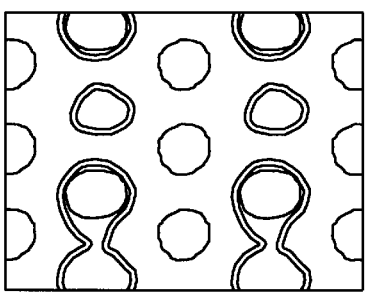
FIGS. 5a and 5b are SEM pictures of holes formed in a layer over a semiconductor substrate using a conventional APSM mask and a mask of another embodiment of the instant invention, respectively.
Figure 5B:
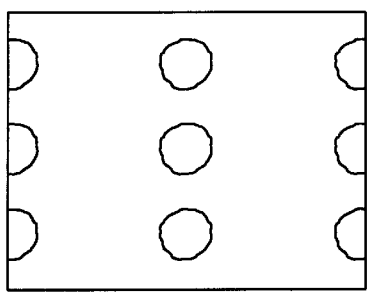

FIGS. 1c and 1d are SEM photographs of holes 112 formed in a layer overlying a semiconductor wafer. FIG. 1c illustrates holes formed using a the mask of one embodiment of the instant invention as is depicted in FIG. 1a. FIG. 1d illustrates holes formed using a conventional APSM mask which uses a material which allows 8% of the impinging energy to pass through the mask in regions equivalent to regions 104 and 106 of FIG. 1a (region 102 is transmissive for this mask). Hence, the mask of FIG. 1d does not use the combination of a phase shift portion 104 and a substantially non-transmissive portion 106. As can be seen in FIG. 1d, the sidelobe problem with the conventional phase-shift mask can be seen by printed features 114. These features may result in holes to be formed in undesirable locations.

FIGS. 2a, 3a, 4a, and 5a are SEM photographs of features printed in a layer overlying a semiconductor substrate using a conventional attenuated phase shift mask. The focus (referred to as "f" in the figures) is −1.0 micron, −0.6 microns, −0.2 microns, and 0.2 microns, respectively, in these figures. As with the features printed in FIG. 1d spurious features are printed on these devices. This is undesirable because resultant structure and/or holes may be formed in undesirable locations due to these printed features.

FIGS. 2b, 3b, 4b, and 5b are SEM photographs of features printed in a layer overlying a semiconductor substrate using a mask of one embodiment of the instant invention. The focus (referred to as "f" in the figures) is −1.0 micron, −0.6 microns, −0.2 microns, and 0.2 microns, respectively, in these figures. As can be readily seen, no spurious features are formed using the masks of the instant invention.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A mask having a repeating pattern which is transferred to a layer overlying a semiconductor wafer so as to define a repeating feature over the semiconductor wafer, said mask comprising:

a transmissive portion which allows a first amount of energy impinging upon it to pass through it, said first amount of energy passing through said transmissive portion of said mask having a phase;

a non-transmissive portion which allows a second amount of energy which impinges upon said non-transmissive portion to pass through said non-transmissive portion, wherein the second amount of energy is less than the first amount of energy;

a semi-transmissive portion situated between said transmissive portion and said non-transmissive portion of said mask and allowing a third amount of energy to pass through said semi-transmissive portion, wherein said third amount of energy is less than the first amount of energy, said third amount of energy passing through said semi-transmissive portion having a phase which is around 180 degrees of out phase with said phase of energy passing through said transmissive portion of said mask;

wherein said transmissive portion has a shape selected from the group consisting of: rectangular, circular, oval, octagonal, square, and any combination thereof;

wherein said semi-transmissive portion is concentric to said transmissive portion and situated between said transmissive portion and said non-transmissive portion such that said semi-transmissive portion comprises a rim surrounding said transmissive portion;

wherein a first edge of the semi-transmissive portion abuts an edge of said non-transmissive portion;

wherein a second edge of the semi-transmissive portion abuts an edge of said transmissive portion;

wherein the first edge has a same shape as the second edge;

wherein a rim width W exists between the first edge and the second edge and measures the width of the rim;

wherein the mask comprises a pattern formed from the transmissive portion and having a distance D between the rim on one side of the pattern and the rim on an opposing side of the pattern, the pattern formed from the transmissive portion for forming a corresponding feature on the semiconductor wafer using a projection lens with a numerical aperture NA and an energy source having a wavelength $\lambda$, wherein the energy source is for emitting energy that passes through the pattern to form the corresponding feature;

wherein the rim width W is less than $\{[(0.82)(\lambda)/(NA)]-(\frac{1}{2}) * D\}$.

2. The mask of claim 1, wherein said non-transmissive portion is comprised of chromium.

3. The mask of claim 1, wherein the third amount of energy is in response to energy impinging on the semi-transmissive portion, and wherein said semi-transmissive portion is comprised of a material which allows between 2 and 18 percent of the energy impinging on the semi-transmissive portion to pass through said semi-transmissive portion.

4. The mask of claim 1, wherein the third amount of energy is in response to energy impinging on the semi-transmissive portion, and wherein said semi-transmissive portion is comprised of a material which allows between 6 and 12 percent of the energy impinging on the semi-transmissive portion to pass through said semi-transmissive portion.

5. The mask of claim 1, wherein the third amount of energy is in response to energy impinging on the semi-transmissive portion, and wherein said semi-transmissive portion is comprised of a material which allows between 8 and 10 percent of the energy impinging on the semi-transmissive portion to pass through said semi-transmissive portion.

6. The mask of claim 1, wherein said impinging energy is comprised of energy selected from the group consisting of: DUV energy, I-line energy, x-ray energy, electron beam energy, optical energy and any combination thereof.

7. The mask of claims 6, wherein the third amount of energy is in response to energy impinging on the semi-transmissive portion, and wherein the thickness of said semi-transmissive portion is around on half the wavelength of the energy impinging on the semi-transmissive portion.

8. The mask of claim 1, wherein the rim width W falls within the range of $(\frac{1}{2}) * D < W < \{[(0.82)(\lambda)/(NA)]-(\frac{1}{2}) * D\}$.

* * * * *